(12) United States Patent
Cheng et al.

(10) Patent No.: US 8,745,550 B2
(45) Date of Patent: Jun. 3, 2014

(54) FRACTURE AWARE OPC

(75) Inventors: Nian-Fuh Cheng, Hsinchu (TW); Yu-Po Tang, Taipei (TW); Chien-Fu Lee, Hsinchu (TW); Sheng-Wen Lin, Kaohsiung (TW); Yong-Cheng Lin, Hsinchu (TW); Wen-Chun Huang, Tainan (TW); Ru-Gun Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/544,014

(22) Filed: Jul. 9, 2012

(65) Prior Publication Data
US 2014/0013287 A1   Jan. 9, 2014

(51) Int. Cl.
*G06F 17/50*   (2006.01)

(52) U.S. Cl.
USPC ............... 716/53; 716/51; 716/54; 716/55

(58) Field of Classification Search
USPC .............................. 716/51, 53–55
See application file for complete search history.

(56) References Cited

U.S. PATENT DOCUMENTS

| | | | |
|---|---|---|---|
| 6,625,801 B1 * | 9/2003 | Pierrat et al. ............ | 716/53 |
| 6,794,096 B2 * | 9/2004 | Kroyan .................. | 430/5 |
| 7,010,764 B2 * | 3/2006 | Pierrat .................. | 716/53 |
| 7,080,349 B1 * | 7/2006 | Babcock et al. .......... | 716/53 |
| 7,237,221 B2 * | 6/2007 | Granik et al. ........... | 716/52 |
| 7,343,582 B2 * | 3/2008 | Mukherjee et al. ....... | 716/53 |
| 7,353,145 B2 * | 4/2008 | Tanaka et al. ........... | 703/2 |
| 7,458,056 B2 * | 11/2008 | Pierrat ................. | 716/53 |
| 7,512,927 B2 * | 3/2009 | Gallatin et al. ......... | 716/51 |
| 7,571,418 B2 * | 8/2009 | Krasnoperova ........... | 716/55 |
| 7,617,478 B2 * | 11/2009 | Rieger et al. ........... | 716/51 |
| 7,669,175 B2 * | 2/2010 | Culp et al. ............. | 716/54 |
| 7,694,267 B1 * | 4/2010 | Ye et al. ................ | 716/53 |
| 7,694,268 B2 * | 4/2010 | Dick .................... | 716/53 |
| 7,707,538 B2 * | 4/2010 | Wong et al. ............ | 716/53 |
| 7,711,504 B2 * | 5/2010 | Pan et al. .............. | 702/85 |
| 7,715,641 B2 * | 5/2010 | Olsson et al. ........... | 382/241 |
| 7,783,999 B2 * | 8/2010 | Ou et al. ............... | 716/136 |
| 7,908,572 B2 * | 3/2011 | Zhang .................. | 716/53 |
| 7,987,434 B2 * | 7/2011 | Granik et al. ........... | 716/50 |
| 8,010,915 B2 * | 8/2011 | Chen et al. ............. | 716/53 |
| 8,103,977 B2 * | 1/2012 | Taoka et al. ............ | 716/50 |
| 8,381,153 B2 * | 2/2013 | Chiang et al. ........... | 716/110 |
| 2003/0008222 A1 * | 1/2003 | Pierrat ................. | 430/5 |
| 2007/0143234 A1 * | 6/2007 | Huang et al. ........... | 706/15 |
| 2008/0115096 A1 * | 5/2008 | Pikus ................... | 716/4 |
| 2009/0278569 A1 * | 11/2009 | Taoka et al. ............ | 326/101 |
| 2010/0011335 A1 * | 1/2010 | Chen et al. ............. | 716/19 |
| 2011/0177457 A1 * | 7/2011 | Maeda et al. ........... | 430/319 |
| 2011/0283244 A1 * | 11/2011 | Abdo et al. ............ | 716/55 |
| 2012/0167020 A1 * | 6/2012 | Abd El Wahed et al. .... | 716/53 |

* cited by examiner

*Primary Examiner* — Naum Levin
(74) *Attorney, Agent, or Firm* — Haynes and Boone, LLP

(57) ABSTRACT

The present disclosure describes an OPC method of preparing data for forming a mask. The method includes setting a plurality of dissection points at the main feature and further includes setting a target point at the main feature. The method includes arranging the two dissection points crossing the main feature symmetrically each other. The method includes separating two adjacent dissection points at one side of the main feature by a maximum resolution of the mask writer. The method includes dividing the main feature into a plurality of segments using the dissection points. The method includes performing an OPC convergence simulation to a target point. The method includes correcting the segments belonging to an ambit of the target point and further includes correcting the segment shared by two ambits.

15 Claims, 6 Drawing Sheets

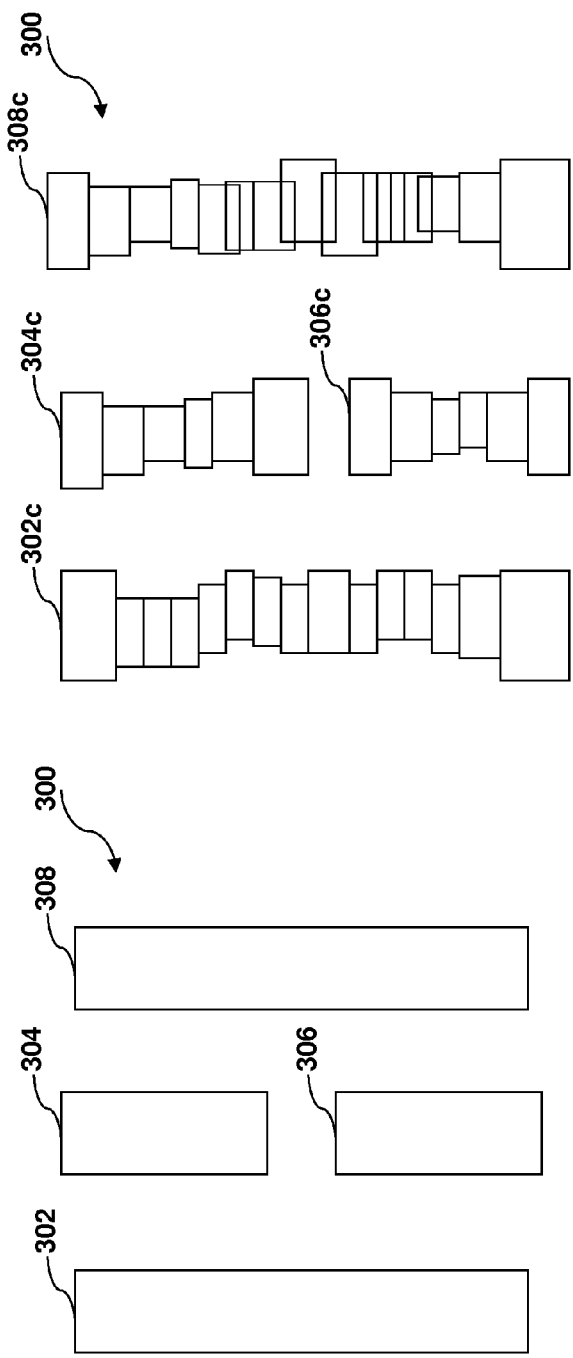
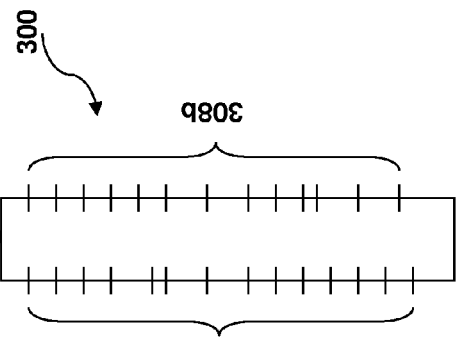
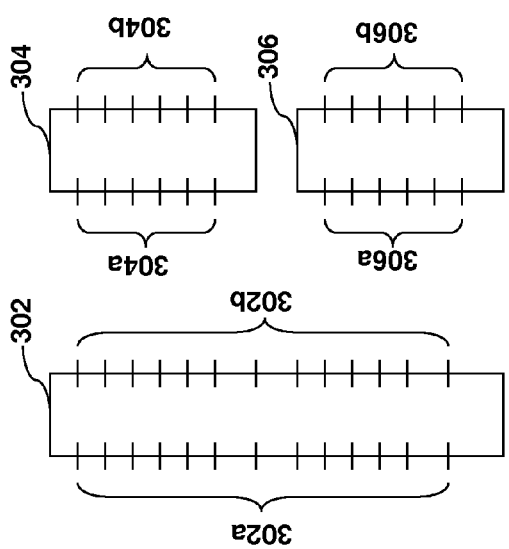
FIG. 3
FIG. 4
FIG. 5

FRACTURE AWARE OPC

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, light diffraction in an optical lithography system becomes an obstacle for further scaling down the feature size. Common techniques used to decrease the light diffraction impact include using optical proximity correction (OPC), a phase shift mask (PSM), and an immersion optical lithography system. A fracture is performed on an IC design layout feature making a mask after the OPC during. The fracture may be executed at asymmetrical dissection points of the IC design layout feature. However, small fragments created by the asymmetrical dissection points. Therefore mask fidelity is degraded by the small fragments and further mask performance is impacted.

Accordingly, what is needed is a method to improve the OPC to reduce number of the small fragments after performing the OPC to an IC design layout data.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 3-5 represent an example of fracturing an integrated circuit (IC) design layout according to one or more embodiments of the present disclosure.

DETAILED DESCRIPTION

Figure 1:
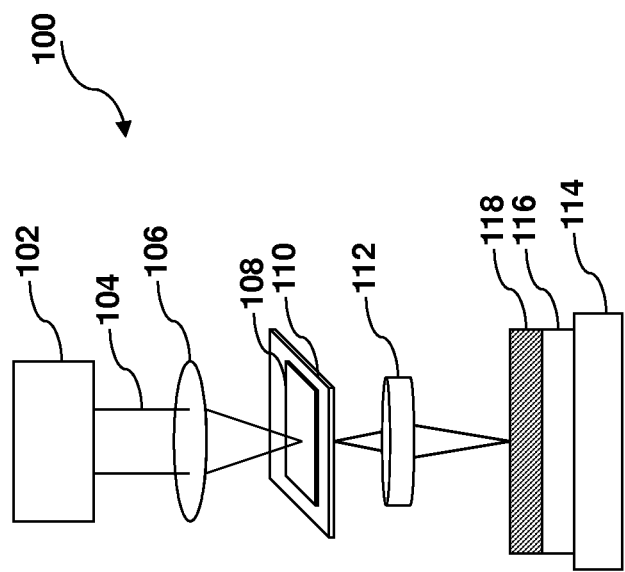
FIG. 1 represents a diagram of an optical lithography system for benefitting from one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, an optical lithography system 100 is an example of a system that can benefit for one or more embodiments of the present disclosure. The optical lithography system 100 includes a light source 102, a light 104, a condense lens 106, a photomask 108, a mask stage 110, a projection lens 112, a substrate stage 114, a substrate 116 and a resist film 118. However, other configurations and inclusion or omission of the device may be possible. In the present disclosure, the system 100 is also referred as a stepper or a scanner, and the photo mask 108 is also referred to as a mask, a photo mask, or a reticle. In the present embodiment, the light source 102 includes a radiation source providing the light 104 having a wavelength range from UV to DUV. For example, a mercury lamp provides UV wavelength, such as G-line (436 nm) or I-line (365 nm), or an excimer laser provides DUV wavelength, such as 248 nm, 193 nm, or 157 nm. The condense lens 106 is configured to guide the light 104 to the photomask 108. The photomask 108 blocks a portion of the light 204 and provides an aerial image of the light 104 to form the patterned light 104. The photomask 108 may be a binary mask (BIM), a super binary mask (SBIM), or a phase shift mask (PSM), which includes an alternative phase shift mask (alt. PSM) or an attenuated phase shift mask (att. PSM). The photo mask 108 is positioned on the mask stage 110. The mask stage 110 includes a plurality of motors, roller guides, and tables; secures the photomask 108 on the mask stage 110 by vacuum; and provides accurate position and movement of the photomask 208 in X, Y, and Z directions during alignment, focus, leveling and exposure operation in the optical lithography system 100. The projection lens 112 includes a magnification lens for reducing the pattern image provided by the photomask 108 and guides the patterned light 104a to the resist film 118 deposited on the substrate 116 secured by the substrate stage 114. The substrate stage 114 includes motors, roller guides, and tables; secures the substrate 116 by vacuum; and provides accurate position and movement of the substrate 116 in X, Y, and Z directions during alignment, focus, leveling and exposure operations in the optical lithography system 100 so that the image of the photomask is transferred onto the substrate in a repetitive fashion (though other lithography methods are possible). The optical lithography system 100, or portions thereof, may include additional items, such as a vacuum system and/or a cooling system.

Continuing with the present embodiments, the substrate 116 deposited with the resist film 118 is loaded on the substrate stage 114 for exposing by the patterned light 104. The resist film 118 includes a positive tone resist or a negative tone resist. The substrate 116 includes a wafer substrate. The wafer substrate includes a silicon wafer. Alternatively or additionally, the wafer may includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), copper (Cu), tungsten (W), nickel (Ni), titanium (Ti), gold (Au), and platinum (Pt), or alloys thereof. The insulator film may include silicon oxide or silicon nitride. The substrate may be a blank mask substrate that includes a low thermal expansion material such as quartz, silicon, silicon carbide, or silicon oxide-titanium oxide compound.

Figure 2:
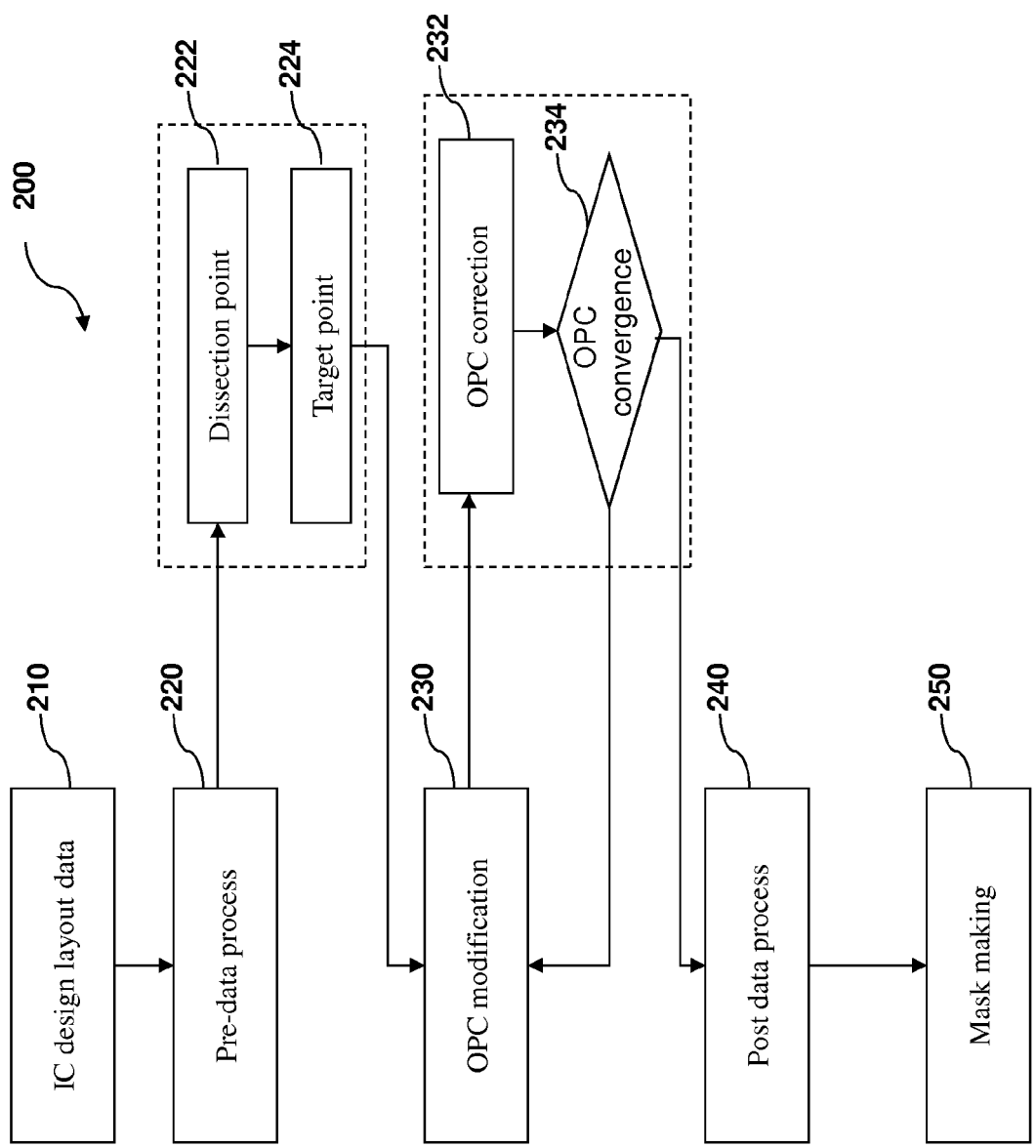
FIG. 2 is a flow chart of making a mask for implementing one or more embodiments of the present disclosure.

Referring to FIG. 2, a flow chart of a method 200 illustrates one embodiment of a mask making process. In the present disclosure, the term mask, photomask and reticle are used to refer to the same item. The method 200 begins at step 210 by providing or receiving an IC design layout data (or IC design layout pattern) from a designer. The designer can be a separate design house or can be part of a semiconductor fabrication facility (fab) for making IC productions according to the IC design layout. In various embodiments, the semiconductor fab may be capable of making photomasks, semiconductor wafers, or both. The IC design layout includes various geometrical patterns designed for an IC product and based on a specification of the IC product.

The IC design layout is presented in one or more data files having the information of the geometrical patterns. In one example, the IC design layout is expressed in a "gds" format. The designer, based on the specification of the product to be manufactured, implements a proper design procedure to carry out the IC design layout. The design procedure may include logic design, physical design, and/or place and route. As an example, a portion of the IC design layout includes various IC features (also referred to as main features), such as active region, gate electrode, source and drain, metal lines and vias of an interlayer interconnection, and openings for bonding pads, to be formed in and on a semiconductor substrate (such as a silicon wafer) and various material layers disposed over the semiconductor substrate. The IC design layout may include certain assist features, such as for imaging effect, processing enhancement, and/or mask identification information. In the present disclosure a feature referred to as a segment.

As shown in FIG. 2, the method 200 proceeds to step 220 for preparing data process. The step 220 includes running a design rule check (DRC) to verify the IC design layout satisfying a semiconductor manufacture process of the fab. The step 220 also includes performing a logic operation (LOP) with small bias corrections requested by the fab. The step 220 further includes step 224 and step 226. The step 222 includes setting a plurality of dissection points at the IC design feature. The step 224 includes setting a target point at the IC design feature. Dissection points and target points are discussed further below, with reference to FIGS. 3-5.

After step 220, the method 200 proceeds to step 230 for applying an optical proximity correction (OPC) modification to the LOP modified design layout data. The step 230 includes dividing the IC design feature into a plurality of segments using the dissection points. The step 230 also includes adjusting a size of the segment based on an OPC rule or an OPC model. The step 230 further includes step 232 and step 234 for evaluating OPC result. The step 232 includes running an OPC simulation based on the size of the segment modified by the OPC. The step 234 includes evaluating an OPC convergence to the target (design IC feature). If the OPC convergence is not satisfied, the method 200 backs to step 230 by moving the segment or adjusting the size of the segment again. This cycle can repeat many times until the satisfied OPC convergence is reached.

After the satisfied OPC convergence is reached at step 234, the method 200 proceeds to step 240 for executing a post data process. The step 240 includes performing a mask rule check (MRC) to verify the OPC modified feature satisfying the semiconductor manufacture process of the fab. In the present embodiments, the MRC verifies a minimum line width of the OPC modified features, or a minimum space between two adjacent OPC modified features is within capability of the semiconductor manufacture process of the fab. The step 240 includes fracturing the complicated OPC modified design layout into a plurality of simple shapes for the mask writer. For example, a complex polygon is fractured into rectangles, trapezoids, or combination thereof. The step 240 also includes converting the fractured OPC modified IC design layout data to electron beam writer format data for a mask writer. The converted IC design layout data proceeds to step 250 for masking a mask (or fabricating a mask). Creating a plurality of designed layout patterns on the mask is carried out by an electron beam writer, an ion beam writer or a laser beam writer. Additional steps can be provided before, during, and after the method 200, and some the steps described can be replaced, eliminated, or moved around for additional embodiments of the method 200.

In one embodiment of the present disclosure, the mask may be a binary mask (BIM), a super binary mask (SBIM), or a phase shift mask (PSM), which includes an alternative phase shift mask (alt. PSM) or an attenuated phase shift mask (att. PSM). In another embodiment, the mask may be a transmissive mask used under ultra-violet light (e. g. G-line, or I-line) or under deep ultra-violet light (DUV), or a reflective mask used under extreme ultra-violet light (EUV).

Referring now to FIGS. 3-5, an IC design layout 300 is an example for implementing one or more embodiments of the present disclosure. As shown the FIG. 3, the IC design layout 300 includes feature 302, feature 304, feature 306, and feature 308. However, other configurations and inclusion or omission of the IC design layout may be possible. In the present disclosure, a feature is also referred to as a main feature, a polygon, or a pattern. As descried at the step 220 of the method 200 shown in FIG. 2, the pre-data process is applied to the layout 300 at the step 200 of the method 200. The pre-data process includes setting the dissection points on the features 302, 304, 306, and 308. FIG. 4 represents an example of setting the dissection points on the layout 300. The dissection points are presented in a short slash line shown in FIG. 4. Dissection points 302a and dissection points 302b are applied to the feature 302, dissection points 304a and dissection points 304b are applied to the feature 304, dissection points 306a and dissection points 306b are applied to the feature 306, and dissection points 308a and dissection points 308b are applied to the feature 308. The dissection points are determined by a critical dimension (CD) of the feature, a shape of the feature, and/or an environment of the feature. Other factors, such as exposing process and exposing tool of the fab, may also determine the dissection points. As shown in FIG. 4, dissection points 302a and 302b are symmetrically distributed across the feature 302. The dissection points 304a and 304b are symmetrically distributed across feature 304 and the dissection points 306a and 306b are also symmetrically distributed across the feature 306 respectively. However, dissection points 308a and 308b are not symmetrically distributed across the feature 308.

In the present embodiments, the OPC technique is applied to the layout 300 at step 230 of the method 200 shown in FIG.

2. The OPC technique includes dividing the feature into a plurality of segments using the dissection points and adjusting the size of the segments. At step 240 of the method 200, the modified segments by the OPC technique are fractured to form a plurality of rectangles and/or trapezoids for the mask writer making the mask. The OPC technique also includes running a simulation to the modified segment to verify an OPC convergence to a feature of the design feature.

FIG. 5 illustrates an example of fracturing the layout 300 for implementing one or more embodiments of the present disclosure. The IC design features are modified by the OPC technique and fractured into the rectangles. Fractured features 302c, 304c, 306c, and 308c are derived from the corresponding features 302, 304, 306 and 308 of the layout 300. The fractured features 302c, 304c, 306c and 308c include rectangles. As shown in FIGS. 4-5, the fracturing is performed at each dissection point crossing the feature in horizontal or vertical direction. Each dissection point generated one fracturing line. In one embodiment, if the dissection points are symmetrically distributed across the feature, two symmetrical dissection points across the feature form two superimposed fracturing lines and therefore one fracturing line is formed from two symmetrical dissection points. The fractured features 302c, 304c and 306c are fractured at the symmetric dissection points. In another embodiment, if the dissection points are asymmetrically distributed across the feature, more fracturing lines are formed, and therefore a small fragment is formed. The fractured feature 308c shown in FIG. 5 is an example of the asymmetrical dissection points across the feature 308. The fractured feature 308c includes a plurality of the small fragments. The mask integrity and performance are seriously impacted by the small fragments caused by the asymmetrical dissection points.

Figure 6:
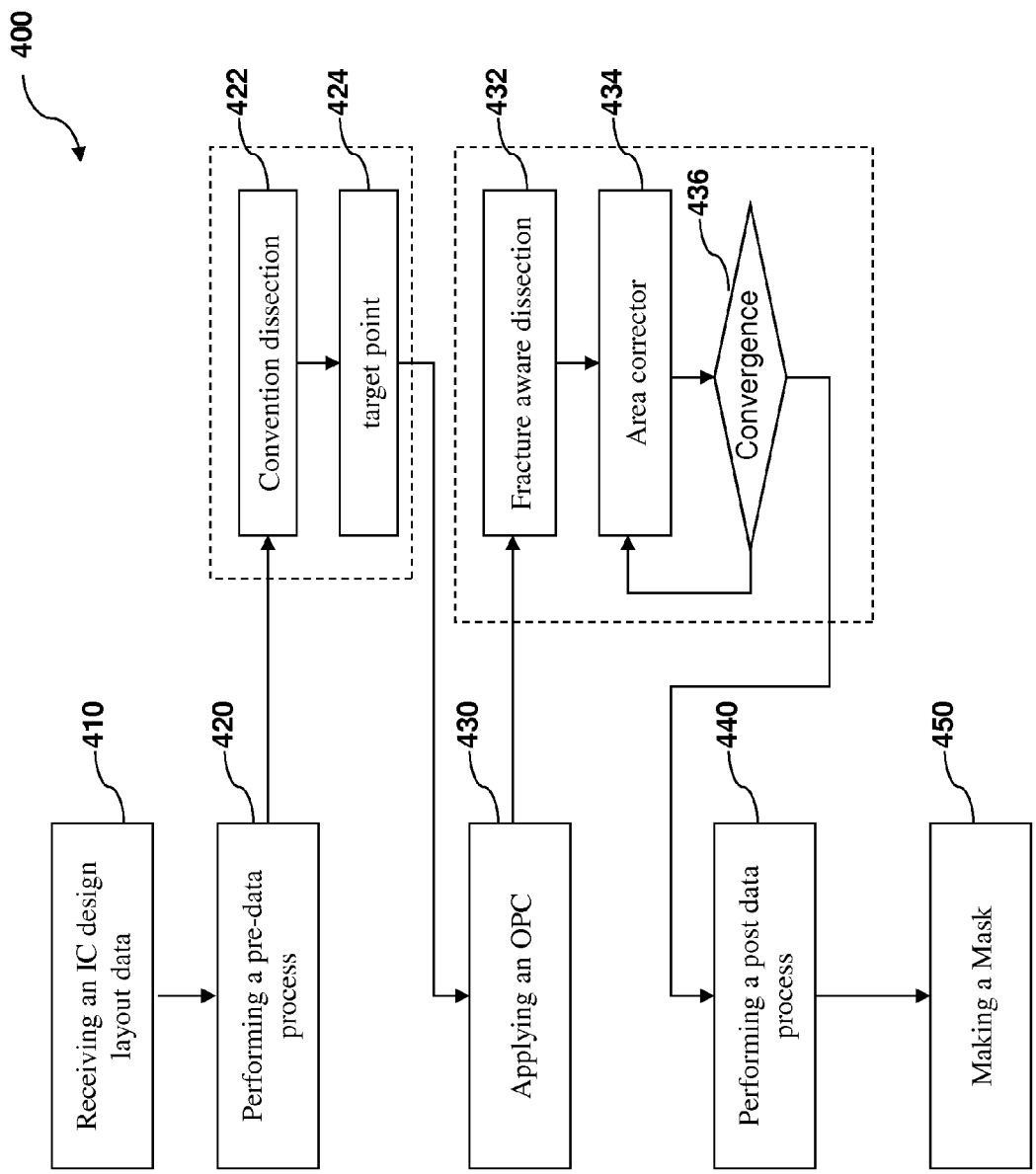
FIG. 6 is a flow chart of making a mask for implementing one or more embodiments of the present disclosure.

Referring now to FIG. 6, a flow chart of a method 400 for making a mask is illustrated according to one or more embodiments of the present disclosure. The method 400 begins at step 410 by providing or receiving an IC design layout data (or IC design layout pattern) from a designer. The IC design layout data includes a main feature. In the present disclosure, a main feature is also referred to as a pattern or a feature. The method 400 proceeds to step 420 for performing pre-data process. The step 420 includes running the DRC to verify the IC design layout satisfying a semiconductor manufacture process of the fab. The step 420 also includes performing a logic operation (LOP) with small bias corrections to the main feature requested by the fab. The step 420 further includes step 422 and step 224. The step 222 includes setting a plurality of dissection points at the IC design feature. The step 424 includes setting a target point at the main feature.

As shown in FIG. 6, after step 220, the method 400 proceeds to step 430 for applying the OPC modification to the IC design layout data. The step 430 includes dividing the IC design feature into a plurality of segments using the dissection points. The step 430 also includes adjusting a size of the segment based on the OPC rule or the OPC model. The step 430 further includes step 432, step 434, and step 436. The step 432 includes inspecting the dissection points on the main feature and making sure two dissection points across the main feature symmetrically are distributed across the main feature. If the two dissection points are not distributed symmetrically across the main feature, the two dissection points are adjusted so that the two dissection points are symmetrically distributed across the main feature. The step 432 also includes making a distance between two adjacent dissection points at same side of the main feature equals to a maximum electron beam writer resolution. For example, the maximum beam resolution is 10 nm for a typical mask writer. Therefore, a number of the fractured segments are reduced. The step 434 includes running an OPC simulation based on the OPC modified segments. The step 436 includes evaluating an OPC convergence to the target (design IC feature). If the OPC convergence is not satisfied, the method 400 backs to step 434 by moving the segment or adjusting the size of the segment again. This cycle can repeat many times until the satisfied OPC convergence is reached. In present embodiments, the step 434 includes performing an area correction. This will discuss in more detail in late paragraph of this present disclosure.

After the satisfied OPC convergence is reached at step 436, the method 400 proceeds to step 440 for executing a post data process. The step 440 includes performing a mask rule check (MRC) to verify the OPC modified feature satisfying the semiconductor manufacture process of the fab. In the present embodiments, the MRC verifies a minimum line width of the OPC modified features, and/or a minimum space between two adjacent OPC modified features is within capability of the semiconductor manufacture process of the fab. The step 440 is the same as 240. The step 450 includes fracturing the complicated OPC modified design layout into a plurality of simple shapes for the mask writer. The converted IC design layout data proceeds to step 450 for masking a mask (or fabricating a mask). Creating a plurality of designed layout patterns on the mask is carried out by an electron beam writer, an ion beam writer or a laser beam writer. Additional steps can be provided before, during, and after the method 400, and some the steps described can be replaced, eliminated, or moved around for additional embodiments of the method 400.

Figure 9:
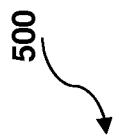
FIGS. 7-9 represent an example of fracturing an integrated circuit (IC) design layout according to one or more embodiments of the present disclosure.
Figure 9:
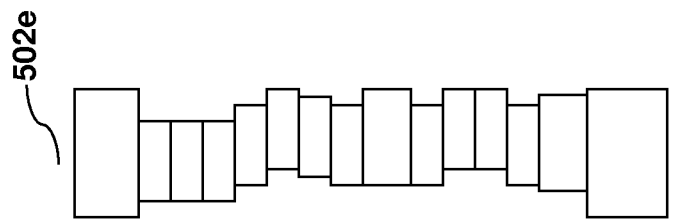
Figure 8:
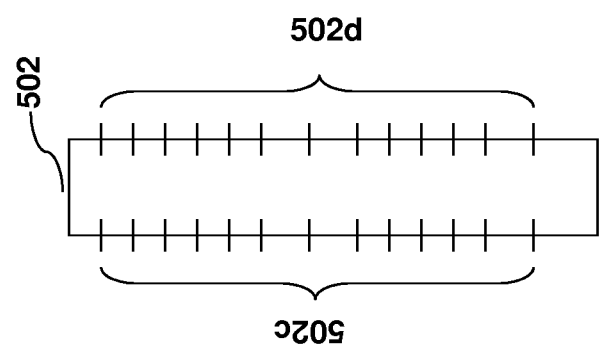
Figure 7:
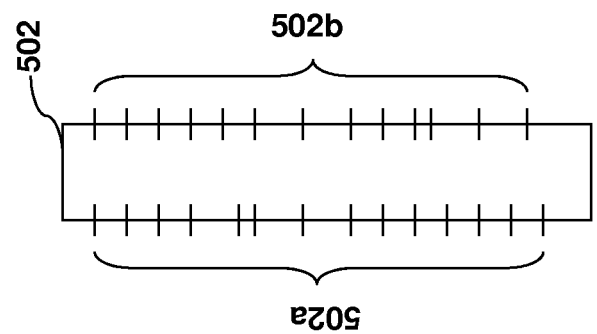

Referring now to FIGS. 7-9, an example of fracturing a layout 500 is illustrated according to one or more embodiments of the present disclosure. The layout 500 includes a main feature 502. As shown in FIG. 7, dissection 502a and dissection 502b are set at the main feature 502 using the method 400 at step 422 as shown in FIG. 6. The dissection 502a is set at one side of the main feature 502 and the dissection 502b is set at another side of the main feature 502b. The dissection 502a is asymmetrical to the dissection 502b across the main feature 502. If the OPC is applied to the main feature 502 based on the dissection 502a and the dissection 502b, a plurality of small fragments are formed after the OPC and the fractured segment as shown in FIG. 5. The mask performance and integrity based on the dissection 502a and dissection 502b at the main feature 502 are impacted by the small fragments.

As shown in FIG. 8, one embodiment of the present disclosure is presented. A dissection 502c and dissection 502d are set at the main feature 502 using method 400 at step 432 as shown in FIG. 6. The dissection 502c is set at one side of the main feature 502 and the dissection 502d is set at another side of the main feature 502b. The dissection 502c and the dissection 502d are formed by modifying the dissection 502a and the dissection 502b respectively using the fracture aware dissection as described at step 432 of the method 400. The dissection 502c is symmetrical to the dissection 502d across the main feature 502. After the OPC is applied to the main feature 502 based on the dissection 502c and the dissection 502d. An OPC modified main feature 502e is formed. As shown in FIG. 9, because the dissection 502c is symmetrical to the dissection 502d across the main feature 502 shown in FIG. 8, after fracturing, no small fragment is formed. Furthermore, the dissection 502c and the dissection 502d are set using the maximum resolution of the electron beam writer, and therefore overall dissection is also reduced. For example, a layout generates about 370,000 fracture shots (segments) for the electron beam writer using the method 200. Contour critical dimension uniformity (CDU) 3 sigma is about 1.62. In another example, the same layout generates about 290,000 fracture shots (segments) for the electron beam writer using the method 400. The contour CDU 3 sigma is about 1.54. The fracture shots are reduced by about 20% and the contour CDU 3 sigma is improved by about 14%.

Figure 10:
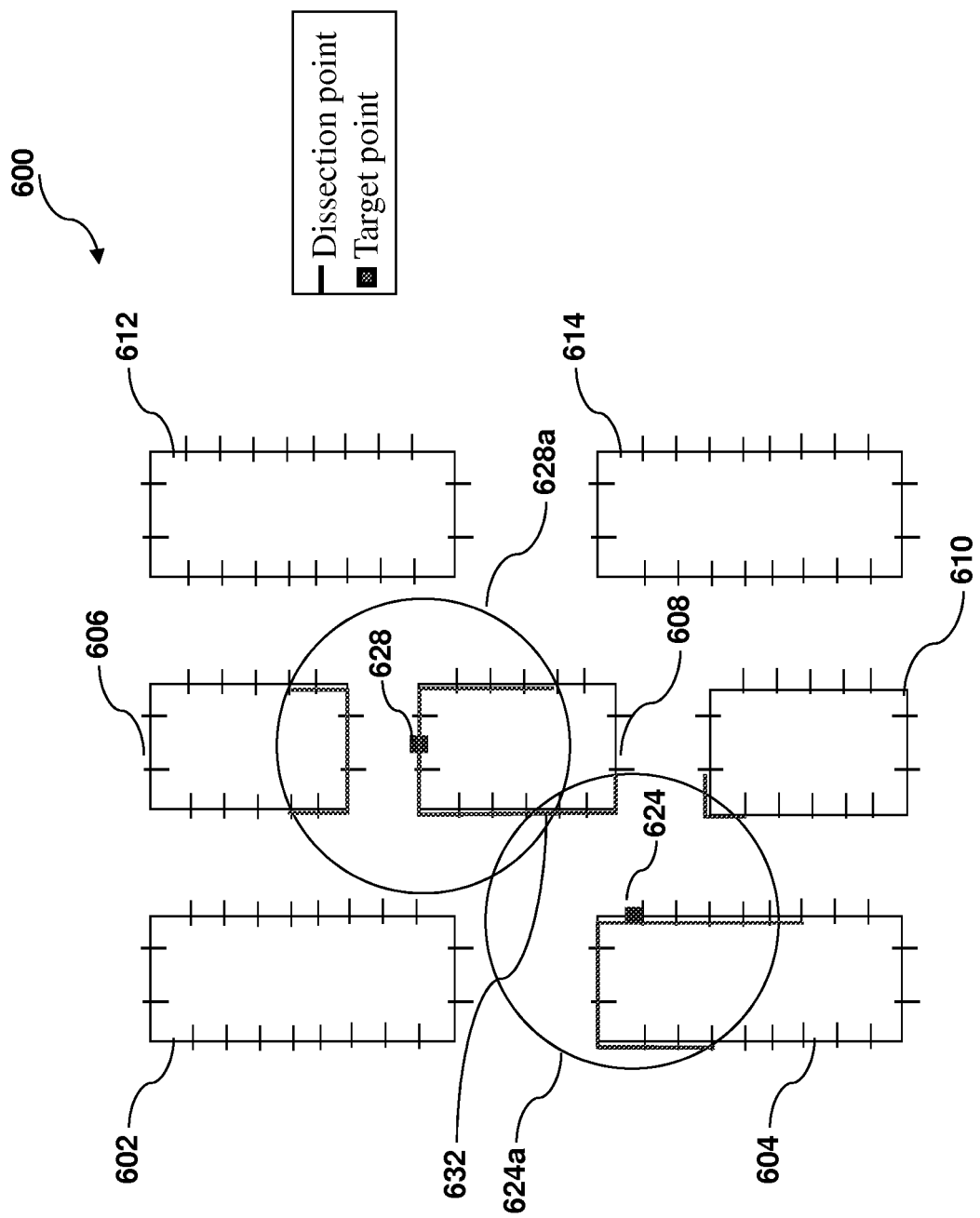
FIG. 10 is an example of applying an area-based correction of a method 400 to a layout according to one or more embodiments of the present disclosure.

Referring now to FIG. 10, an example of applying an area-based correction of the method 400 to a layout 600 is presented according to one or more embodiments of the present disclosure. The layout 600 includes features 602, 604, 608, 610, 612, and 614. As shown in FIG. 10, a plurality of symmetrical dissection points is set at the features 602-614. The OPC technique is applied to the features 604-614 to generate the corresponding modified OPC feature for each feature. In the present embodiments, a target point 624 is set at the feature 604 and a target point 628 is set at the feature 608 as shown in FIG. 10. The target points are used to verify the corresponding modified OPC feature convergence for the feature. For example, the target point 624 is used to verify OPC convergence for the feature 604 and the target point 628 is used to verify OPC convergence for the feature 608. In the present embodiments, each target point also has an influence ambit. For example, the target point 624 has an inference ambit 624a and the target point 628 has an inference ambit 628a.

In the present embodiments, when verifying the OPC convergence for the feature, all the segments generated from the symmetrical dissection points are considered and corrected simultaneously. The segment overlapped (shared) by the ambits of multiple target points is corrected by a weighed factor. The area-based correction approach provides more degree of freedom (more segments) for the OPC convergence while not degrading the mask fidelity.

For example, as shown in FIG. 10, the correction for the OPC convergence to the target 624 of the feature 604 is presented. All the segments belonging to the ambit 624a of the target 624 are corrected. The segments to be corrected for the OPC convergence to the target 624 are not only from the feature 604, but also from the feature 608 and the feature 610. All the segments located in the ambit 624a are under consideration for correction. A segment 632 is overlapped by the ambit 624a of the target 624 and the ambit 628a of the target 628. A correction of the segment 632 is based on both the OPC convergence of the feature 604 and the OPC convergence of the feature 608.

In another example, the correction for the OPC convergence of the target 628 of the feature 608 shown in FIG. 10, all the segments belonging to the ambit 628a of the target 628 are corrected. The segments to be corrected for the OPC convergence of the target 628 are not only from the feature 608, but also from the feature 606. A segment 632 is overlapped by the ambit 624a of the target 624 and the ambit 628a of the target 628. A correction of the segment 632 is based on both the OPC convergence of the feature 604 and the OPC convergence of the feature 608.

Thus, the present disclosure describes a method of forming a mask. The method includes receiving an integrated circuit (IC) design layout including a main feature, performing a pre-data preprocess, modifying the IC design layout using an optical proximity correction (OPC) technique, fracturing the OPC modified IC design layout into a polygon, and writing the OPC modified IC design layout data onto a mask substrate using a mask writer. The method includes setting a plurality of dissection points at the main feature and further includes setting a target point at the main feature. The method includes arranging the two dissection points crossing the main feature symmetrically each other so that two fracturing lines generated by the two dissection points superimpose to form one fracturing line. The method includes separating two adjacent dissection points at one side of the main feature by a maximum resolution of the mask writer. The method includes dividing the main feature into a plurality of segments using the dissection point. The method includes adjusting size of the segment. The method includes performing an OPC convergence simulation to the target point. The method includes correcting the segments belonging to an ambit of the target point and further includes correcting the segment shared by two ambits.

The present disclosure also describes a method of preparing data for making a mask. The method includes receiving an integrated circuit (IC) design layout comprising a main feature, performing a pre-data process, modifying the IC design layout by applying an optical proximity correction (OPC) technique to the IC design layout data, and applying a post data treatment. The performing the pre-data process includes setting a target point at the main feature. The applying the post data treatment includes fracturing the OPC modified IC design layout into a polygon. The method further includes writing the OPC modified IC design layout onto a mask substrate using a mask writer. The method includes arranging two dissection points symmetrically across the main feature and further includes separating two adjacent dissecting points at same side of the main feature by maximum resolution of the mask writer. The method includes running an OPC convergence simulation to the target point. The target point has an ambit which includes a plurality of segments. The method includes correcting the segment belongs to the ambit and further includes correcting the segment shared by two ambits.

In another embodiment, a method of preparing data for making a mask is presented. The method includes receiving an integrated circuit (IC) design layout data comprising a main feature, performing a pre-data process, modifying the IC design layout by applying an optical proximity correction (OPC) technique to the IC design layout data, and applying a post data process. The applying the post data process includes fracturing the OPC modified IC design layout into a polygon. The performing the pre-data process includes setting a target point at the main feature. The modifying the IC design layout includes setting two dissection points symmetrically across the main feature, separating two adjacent dissection points at same side of the main feature by a maximum resolution of a mask writer, forming a segment using the dissection points, running an OPC convergence simulation to the target point, wherein the target point having an ambit including a segment, correcting the segment belonging to the ambit, and further correcting the segment shared by two ambit. The method further includes writing the OPC modified IC design layout onto a substrate using a mask writer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a mask, the method comprising:
   receiving an integrated circuit (IC) design layout including a main feature;

modifying the IC design layout using an optical proximity correction (OPC) technique;

applying a post data process, wherein applying the post data process includes fracturing the OPC modified IC design layout into a plurality of discrete polygons; and writing the OPC modified IC design layout data onto a mask substrate using a mask writer;

wherein modifying the IC design layout data using OPC includes correcting a segment belonging to an ambit of a target point and correcting a segment shared by two ambits.

2. The method of claim 1, further comprising performing a pre-data process that includes setting a plurality of dissection points at the main feature.

3. The method of claim 2, further comprising setting a target point at the main feature.

4. The method of claim 1, wherein modifying the IC design layout using the OPC includes arranging two dissection points crossing the main feature symmetrically each other so that two fracturing lines generated by the two dissection points superimpose to form one fracturing line.

5. The method of claim 1, wherein modifying the IC design layout using the OPC includes separating two adjacent dissection points at one side of the main feature by a maximum resolution of the mask writer.

6. The method of claim 1, wherein modifying the IC design layout using the OPC includes dividing the main feature into a plurality of segments using a dissection point.

7. The method of claim 1, wherein modifying the IC design layout data using OPC includes performing an OPC convergence simulation to a target point.

8. A method of preparing data for making a mask, the method comprising:

receiving, using an optical lithography system, an integrated circuit (IC) design layout comprising a main feature;

performing a pre-data process, wherein performing the pre-data process includes setting a target point at the main feature;

modifying the IC design layout using the target point by applying an optical proximity correction (OPC) technique to the main feature; and applying a post data treatment, wherein applying the post data treatment includes fracturing the OPC modified IC design layout into a plurality of discrete polygons;

wherein applying the OPC technique includes correcting a segment belonging to an ambit and correcting a segment shared by two ambits.

9. The method of claim 8, further comprising writing the OPC modified IC design layout onto a mask substrate using a mask writer.

10. The method of claim 8, wherein applying the OPC technique to the IC design layout includes arranging two dissection points symmetrically across the main feature.

11. The method of claim 10, further comprising separating the two adjacent dissecting points at same side of the main feature by maximum resolution of the mask writer.

12. The method of claim 8, wherein applying the OPC technique to the IC design layout includes running an OPC convergence simulation to the target point.

13. The method of claim 12, wherein the target point includes an ambit including a plurality of segments.

14. A method of preparing data for making a mask, the method comprising:

receiving, using an optical lithography system, an integrated circuit (IC) design layout data comprising a main feature;

performing a pre-data process, wherein performing the pre-data process includes setting a target point at the main feature;

modifying the IC design layout by applying an optical proximity correction (OPC) technique to the IC design layout data, wherein modifying the IC design layout includes:

setting two dissection points symmetrically across the main feature, separating two adjacent dissection points at same side of the main feature by a maximum resolution of a mask writer, forming a segment using the dissection points, running an OPC convergence simulation to the target point, wherein the target point having an ambit including a segment, correcting the segment belonging to the ambit, and further correcting the segment shared by two ambits; and applying a post data process, wherein applying the post data process includes fracturing the OPC modified IC design layout into a plurality of discrete polygons.

15. The method of 14, further comprising writing the OPC modified IC design layout onto a substrate using a mask writer.

* * * * *